United States Patent
Nagashima et al.

(10) Patent No.: US 6,798,655 B2
(45) Date of Patent: Sep. 28, 2004

(54) LIQUID COOLING SYSTEM FOR ALL-IN-ONE COMPUTER

(75) Inventors: Kenichi Nagashima, Ebina (JP); Masao Miyawaki, Hadano (JP); Tsuyoshi Nakagawa, Hadano (JP); Shigenori Yamagata, Hadano (JP); Tomoyasu Itou, Machida (JP); Susumu Saito, Hadano (JP); Akihiko Seki, Ebina (JP); Kenichi Saito, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/347,365

(22) Filed: Jan. 21, 2003

(65) Prior Publication Data

US 2003/0128511 A1 Jul. 10, 2003

Related U.S. Application Data

(63) Continuation of application No. 09/795,112, filed on Jun. 18, 2001, now Pat. No. 6,519,146.

(30) Foreign Application Priority Data

Dec. 19, 2000 (JP) .................................... 2000-385717

(51) Int. Cl.⁷ .................................................. G06E 1/20
(52) U.S. Cl. ...................... 361/687; 361/689; 361/695; 361/719; 165/104.33; 174/15.1
(58) Field of Search ................................. 361/686, 687, 361/689, 695, 701, 706, 705, 699, 715, 717–718, 688, 700, 707; 165/41, 67, 80.2, 80.3, 80.4, 104.32, 104.33, 104.34, 185, 104.27; 175/15.1, 152, 35 R, 16.3; 454/184; 364/708.1; 62/259.2; 345/87; 359/44, 48, 49, 86, 216; 415/114, 177, 178; 417/13, 44.8, 92, 366, 377; 257/710–715

(56) References Cited

U.S. PATENT DOCUMENTS

| | | | | |
|---|---|---|---|---|
| 5,285,347 A | * | 2/1994 | Fox et al. | 361/699 |
| 5,646,824 A | * | 7/1997 | Ohashi et al. | 361/699 |
| 5,757,615 A | * | 5/1998 | Donahoe et al. | 361/687 |
| 5,764,483 A | * | 6/1998 | Ohashi et al. | 361/699 |
| 6,263,957 B1 | * | 7/2001 | Chen et al. | 165/80.4 |
| 6,510,052 B2 | * | 1/2003 | Ishikawa et al. | 361/687 |
| 6,519,148 B2 | * | 2/2003 | Nakagawa et al. | 361/687 |
| 6,556,439 B2 | * | 4/2003 | Shibasaki | 361/687 |

FOREIGN PATENT DOCUMENTS

| | | |
|---|---|---|
| JP | 7-142886 | 6/1995 |
| JP | 11-154036 | 6/1999 |

OTHER PUBLICATIONS

"Conditional Access Specification for Digital Satellite Broadcasting Services Using Broadcasting Satellites," ARIB STANDARD–B25, Association of Radio Industries and Businesses, p. 13.

* cited by examiner

*Primary Examiner*—Michael Datskovsky
(74) *Attorney, Agent, or Firm*—Mattingly, Stanger & Malur, P.C.

(57) ABSTRACT

A desk-top type computer with a built-in LCD includes a chassis, a planar display attached to the chassis, a mother board attached to the chassis, heat generating portions including a CPU mounted on the mother board, and a memory device electrically connected to the mother board. A heat receiving head is fixed to at least one of the heat generating portions including the CPU, and the head is connected a tube filled with a cooling liquid. The tube is arranged in a serpentine or zigzag shape in a clearance between the chassis and the planar display facing the chassis. The cooling medium liquid circulating in the tube serves as a heat transferring medium to absorb the heat at the heat generating portion, and radiate the heat through the tube disposed in the clearance between the LCD and the chassis.

11 Claims, 14 Drawing Sheets

(FORMED INTEGRALLY WITH COVER)

FIG. 9A
FIG. 9B
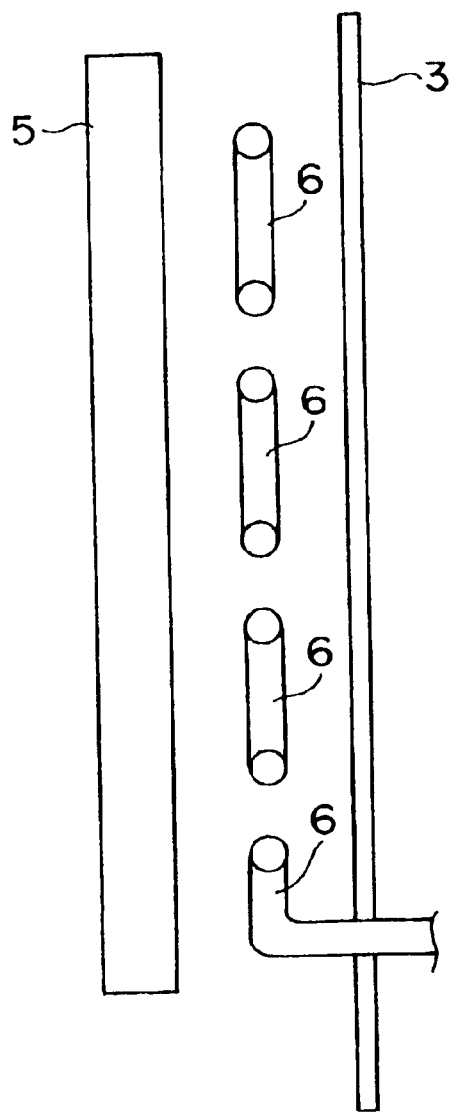
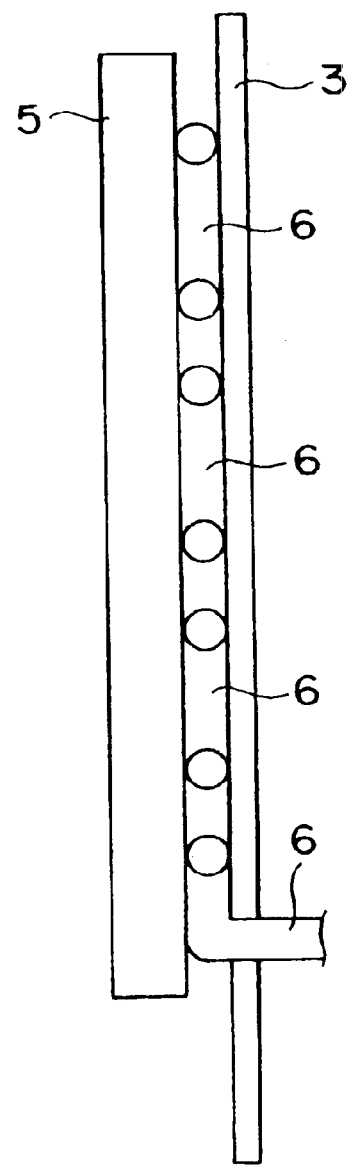

LIQUID COOLING SYSTEM FOR ALL-IN-ONE COMPUTER

This is a continuation application of U.S. Ser. No. 09/795,122, filed Jun. 18, 2001 now U.S. Pat. No. 6,519,146.

BACKGROUND OF THE INVENTION

The present invention relates to a desk-top type computer integrated or combined with a liquid crystal display (LCD), or an all-in-one computer, and more particularly, to a liquid cooling technology for a heat generating elements in such a desk-top type computer.

A conventional art concerning a cooling system for electronic equipment is such that a metal plate or heat pipe is interposed between heat generating elements and a metal cabinet wall in the electronic equipment to thereby interconnect them thermally, thus radiating the heat generated by the heat generating elements through the metal cabinet wall.

Japanese Patent Application Laid-Open Publication No. H07-142886 discloses a technology for liquid-cooling heat generating elements in electronic equipment. It describes such a construction that the heat generated by semiconductor heat generating elements in the electronic equipment is received by a heat receiving head, a cooling medium liquid in which head is in turn transported through a flexible tube to a heat radiating head provided on a metal cabinet of a display unit to thereby radiate the heat generated by the semiconductor heat generating elements through the heat radiating head via the cooling medium liquid from the metal cabinet effectively. The above-mentioned publication also discloses an example of using a heat pipe as a heat transporting device, which has a construction that the heat generated by the semiconductor devices is transferred through a heat receiving metal plate to the heat pipe and then thermally connected to the other end of the heat pipe directly attached to the wall surface of a metal cabinet, which serves as a heat radiating surface, to be radiated to the outside.

Further, Japanese Patent Application Laid-Open Publication No. H11-154036 discloses a heat dissipation technology for a desk-top type computer having an LCD unit. This publication specifically describes that the air entered in a casing through an air inlet hole in a lower casing section thereof, which surrounds the LCD, a mother board, etc., is warmed by the heat from the mother board and a power source and then discharged to the outside through heat radiating holes formed in the top and back surfaces of an upper casing section and in the top surface of the lower casing section. The publication further describes that a cooling fan is provided at lower portion of the mother board to improve the cooling efficiency.

In a desk-top type computer that typically comprises a body section having an LCD and a stand portion for rotatably supporting the body section, heat is generated by a CPU or MPU, etc. (hereinafter generally referred to as CPU) built in the body section, and the heat thus generated sometimes makes the operations of circuits unstable. It may also cause to thermal deformation of mechanisms. In particular, with an increase in the operating frequency of the CPU in the recent years, the value of heat generated increases, and it has been desired to effectively radiate the thus increased heat.

In the conventional art, there were discussions on the cooling by means of a cooling medium liquid and that using a heat pipe for general electronic equipment. Concerning the cooling technologies for a desk-top type computer integrated with an LCD, however, only some air cooling technologies have been suggested as is in Japanese Patent Application Laid-Open Publication No. H11-154036. There have been no technologies disclosed presently of a cooling construction that is suited for the desk-top type computer wit the built-in LCD.

It is conceivable to cope with an increase in the value of heat generated in the desk-top type computer by increasing the ventilation capacity of a fan. This measure, however, may give rise to a problem of noise due to the blowing sound of the fan and another problem of vibration during the operation of the computer. It is also conceivable to increase the heat radiation capacity by enlarging the size of an air cooling heat sink or heat radiating plate for radiating the heat generated by the heat generating elements such as a CPU. This countermeasure is contradictory to the requirement for downsizing or miniaturization of the desk-top computer.

SUMMARY OF THE INVENTION

It is an object of the invention to provide a cooling technology, which is useful to be applied a desk-top type computer with an LCD unit, and to propose a novel construction for obtaining an appropriate heat radiating effect that is impossible with the prior art.

A display unit integral type computer, or an all-in-one computer, comprises a chassis, a plane-shaped display attached to the chassis, a mother board attached to the chassis, a variety of electronic devices and a CPU mounted on the mother board, and a memory device electrically connected to the mother board. A heat receiving head is fixed to at least one heat generating portion including the CPU. A tube filled with a cooling medium liquid is connected to the heat receiving head, and the tube is secured onto the surface of the chassis, which is disposed opposite to the plane-shaped display with a clearance therefrom. The cooling medium liquid circulating through the tube serves as a heat transferring medium to radiate the heat generated at the heat generating portion through the tube on the chassis surface and the chassis itself.

Alternatively, the tube may be secured onto the back surface of the plane-shaped display, which is opposite to the chassis and attached thereto with the clearance therefrom. The cooling medium liquid circulating through the tube serves as a heat transferring medium, thus radiating the heat generated at the heat generating portion through the tube secured to the back surface of the plane-shaped display and the plane-shaped display itself.

Further alternatively, the tube may be led through the clearance between the back surface of the plane-shaped display and the surface of the chassis and secured onto the back surface of the plane-shaped display and onto the chassis surface. The cooling medium liquid circulating through the tube serves as a heat transferring medium, thus radiating the heat generated at the heat generating portion through the tube on the back surface of the plane-shaped display and the chassis surface, the chassis, and the plane-shaped display.

BRIEF DESCRIPTION OF THE DRAWINGS

FIGS. 9A and 9B are section views showing configuration examples concerning the layout of a tube, a main chassis, and an LCD for liquid cooling according to embodiments of the invention;

DETAILED DESCRIPTION OF THE PREFERRED EMBODIMENTS

Figure 1:
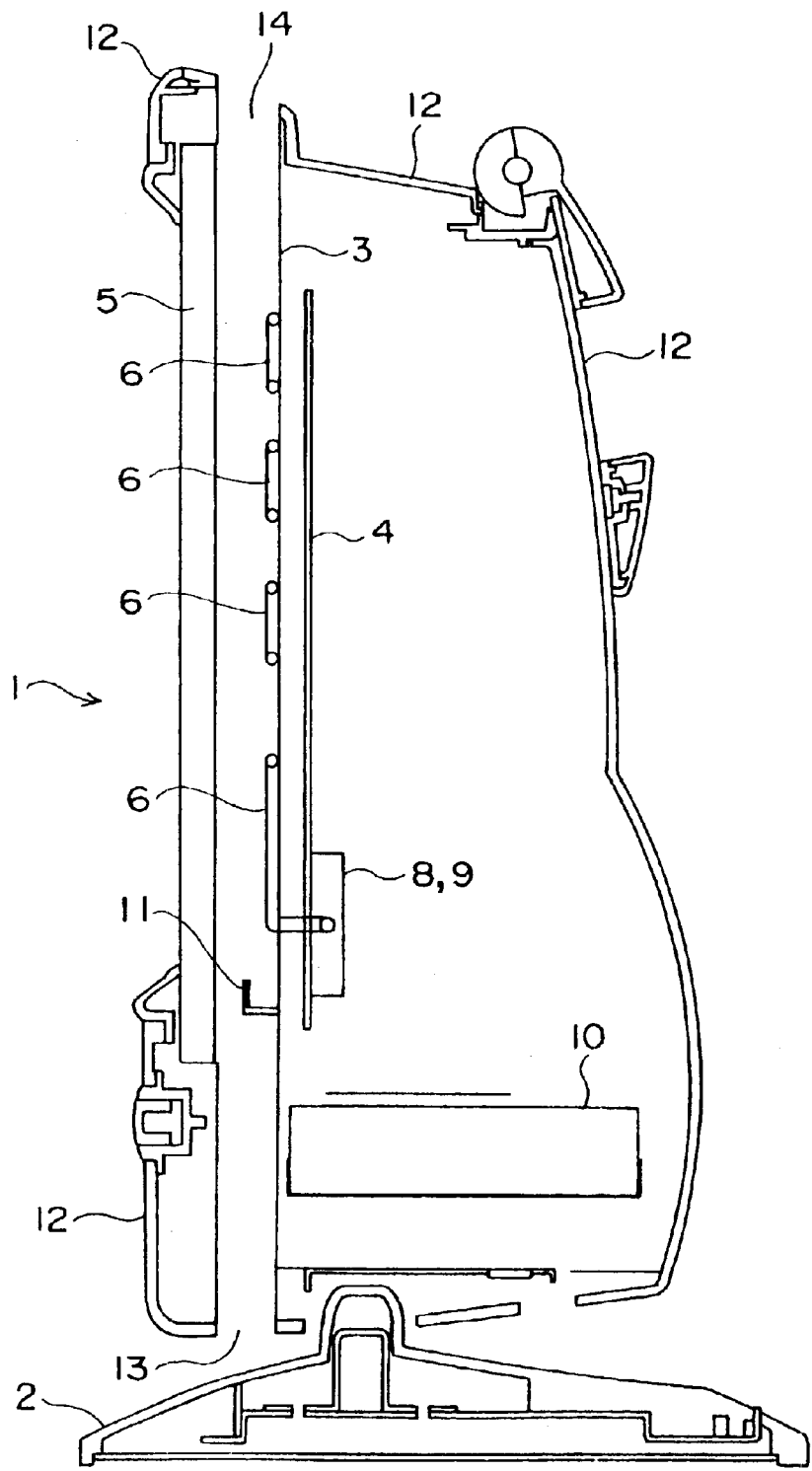
FIG. 1 is a section view showing an overall configuration for liquid cooling of a desktop type computer according to an embodiment of the invention.
Figure 2:
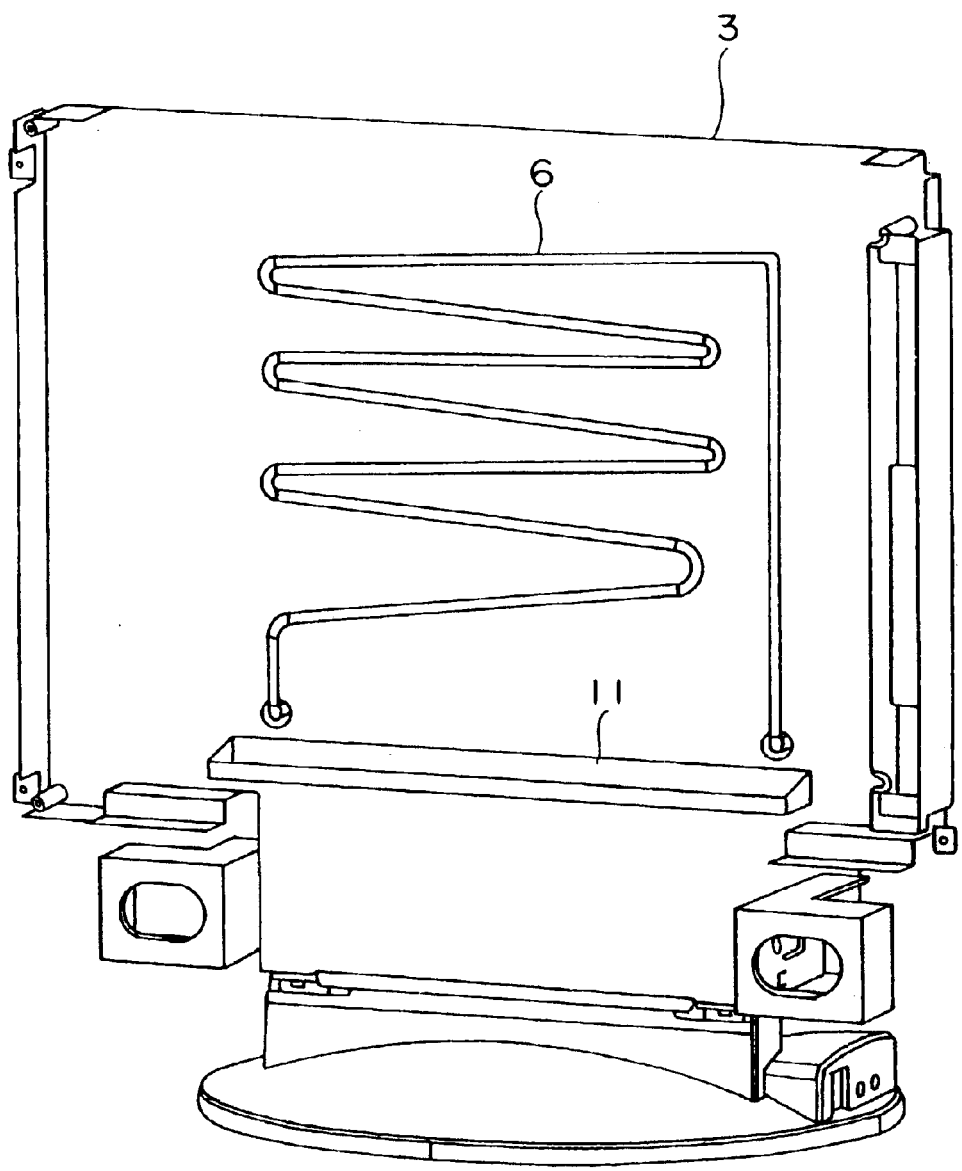
FIG. 2 is a front view of the overall configuration of FIG. 1 in which a tube and a liquid receiver are fixed onto a main chassis.
Figure 3:
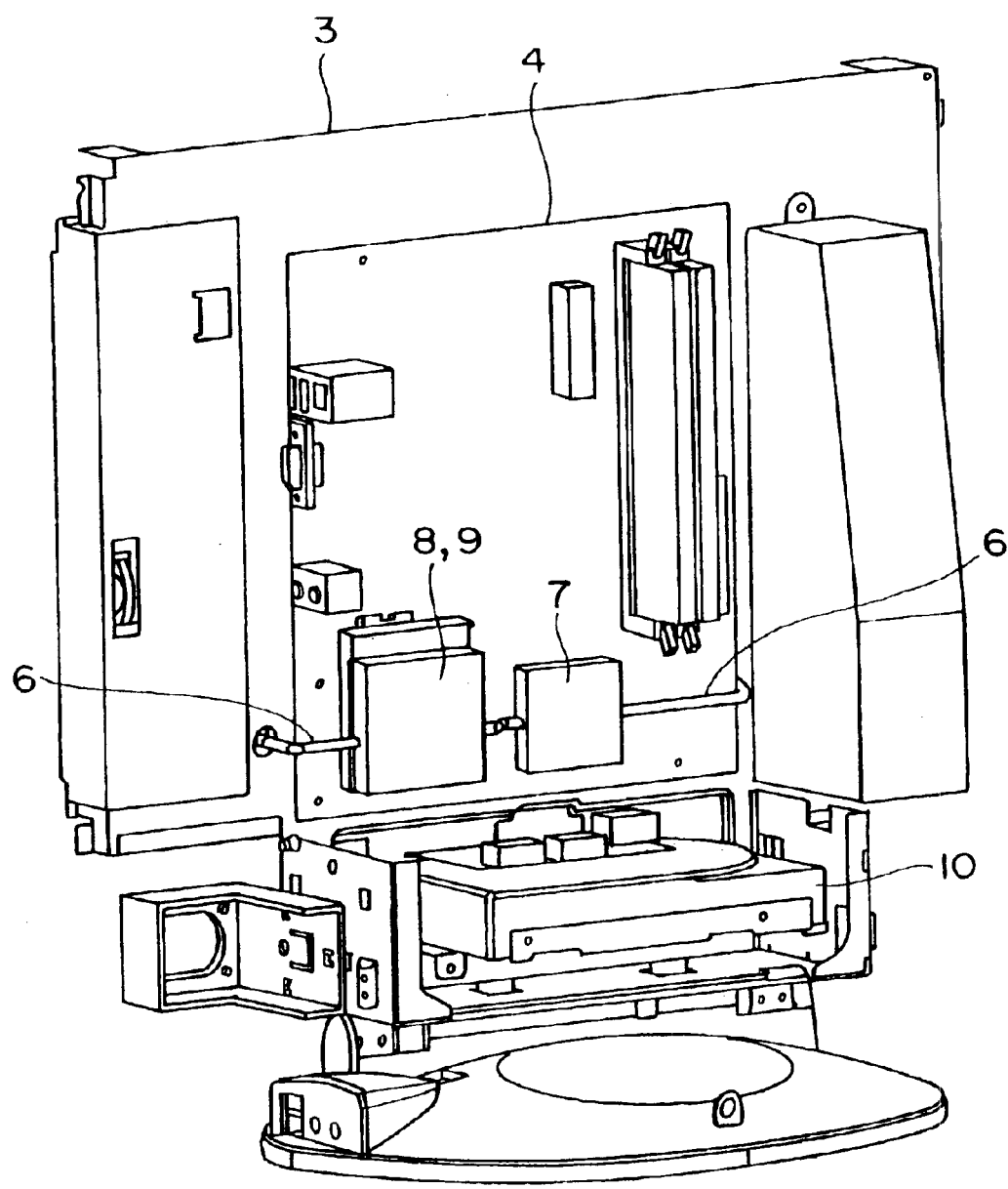
FIG. 3 is a rear view of the overall configuration of FIG. 1 in which an assembly of a CPU and a heat receiving head, and a pump are disposed on a mother board.

FIG. 1 shows an overall configuration for liquid cooling of a desk-top type computer according to an embodiment of the invention, FIG. 2 is a front view of the overall configuration of FIG. 1 in which a tube and a liquid receiver are fixed to a main chassis, and FIG. 3 is a rear view of the overall configuration of FIG. 1, in which an assembly of a CPU and a heat receiving head, and a pump are disposed on a mother board.

As shown in FIGS. 1–3, the desk-top type computer comprises a computer body 1 and a stand 2 for rotatably supporting the body 1, and in the computer body 1, a liquid crystal display (LCD) panel 5 is mounted on the front side of a main chassis 3 and the mother board (a control circuit board) 4 is disposed on the back side thereof.

On the mother board 4 are arranged a variety of electric/electronic devices, ICs, electronic circuits, etc. necessary for the operations of the computer as well as the CPU 9, power source circuits, and other elements generating heat during the operation of the computer. On the back side of the LCD panel 5, i.e. on its side facing the main chassis 3 are arranged a large number of connectors, and electric wiring lines, connected to the connectors, extend through an opening in the main chassis 3 and are connected to terminals of the mother board 4. Thus, a space is formed between the main chassis 3 and the LCD panel 5 for routing the electric wiring lines etc.

Referring to FIG. 3, on the back side of the mother board, which is opposite to the main chassis side thereof, are arranged the CPU 9, the power source circuits, a hard disk drive (HDD) 10, etc, which generate heat, and a heat receiving head 8 (see FIG. 1) is provided in contact with the heat generating elements for transferring their heat to a cooling medium liquid. Incidentally, the heat generating sources in the desk-top type computer include, besides the CPU, a chip set, a display controller, a power source portion, an HDD, an FDD, a CD-ROM portion, a CDR-R/W portion, and a DVD-ROM portion. The heat receiving head 8 is made of a metal material having a high heat transfer rate and has its interior filled with a cooling medium liquid, which is thermally transported to a heat radiating portion distanced from the heat receiving head. Used as the cooling medium liquid is water or ethylene glycol, but it is not limited to them. The cooling medium liquid is pressured by a pump 7 shown in the figure to collect heat at the heat receiving head 8 while it is being circulated through a tube 6.

Figure 13:
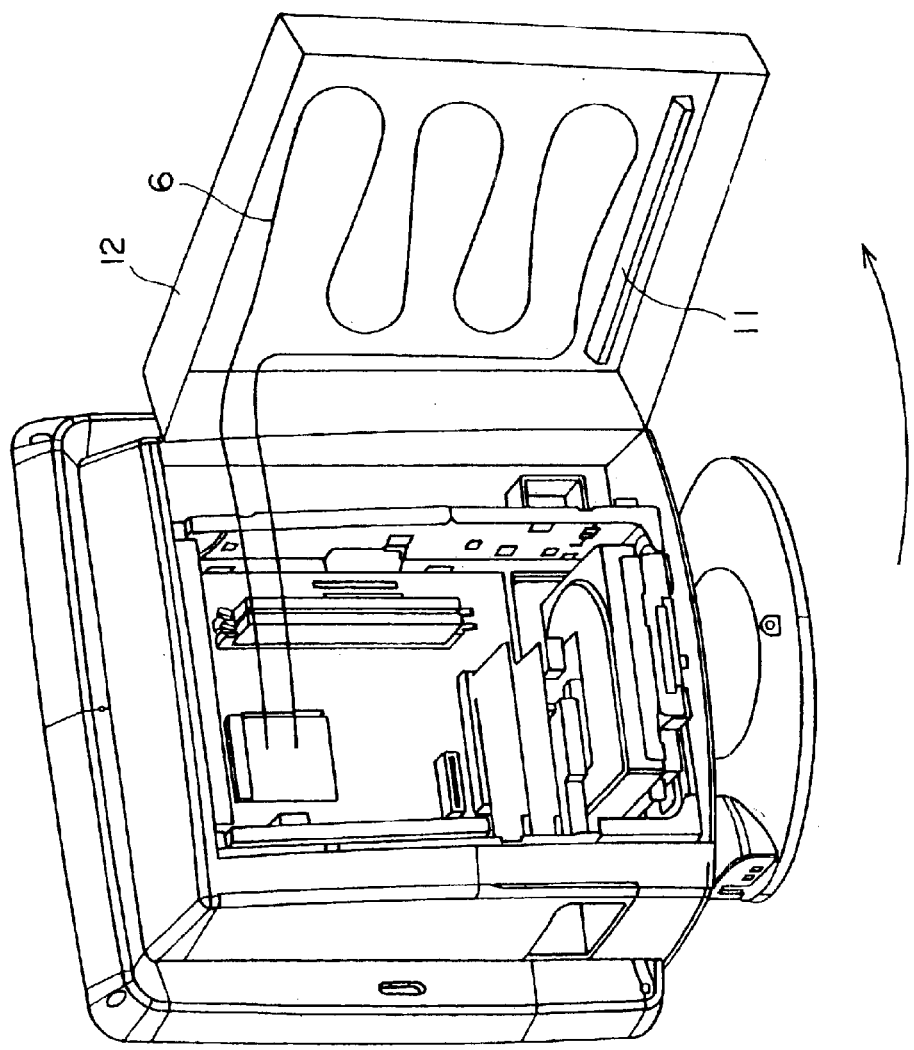
FIG. 13 is a section view of a configuration example for liquid cooling according to an embodiment of the invention, in which a tube and a liquid receiver are disposed on a rear cover.
Figure 14:
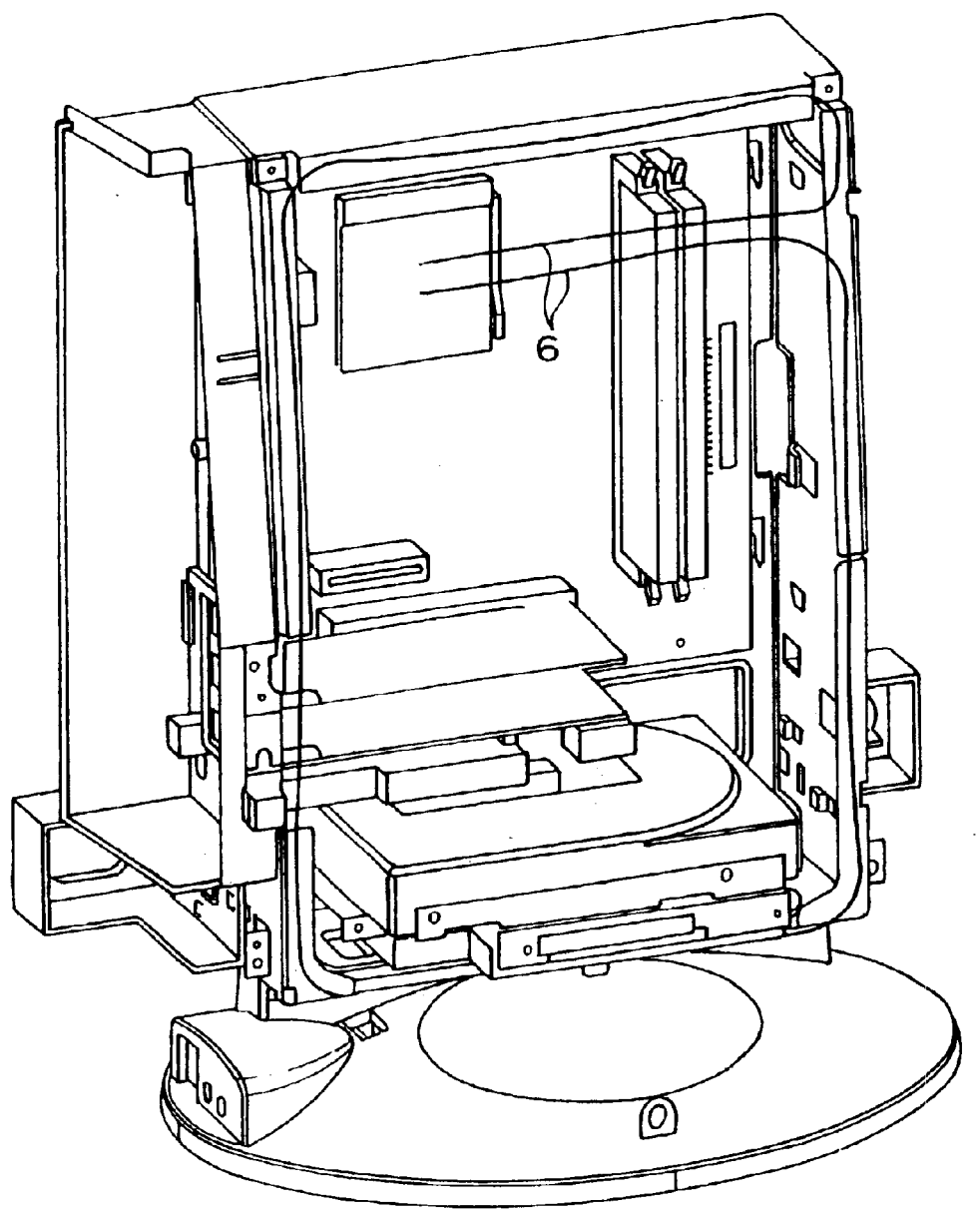
FIG. 14 is a section view of a configuration example for liquid cooling according to an embodiment of the invention, in which a tube is disposed on a main chassis facing a rear cover.

Although the tube 6 for transporting the cooling medium liquid is typically made of copper with a good heat transfer rate and a corrosion resistance, any other material may be used as far as they have the above-mentioned properties. For example, a flexible tube made of a silicon-based compound can be employed because it has those properties. As will be described later, in particular such a tube as shown in FIGS. 13 and 14 is routed in the same manner as a cable, and therefore a flexible tube may be used as a portion other than those fixed to the cover or the chassis. For instance, part of the path requiring flexibility may be made by a flexible tube of silicon-based compound in place of a copper tube.

The tube 6 for transporting the cooling medium liquid goes through the heat receiving head 8, the pump 7, and the opening in the main chassis up to the front side of the main chassis (see FIG. 2), i.e. up to the space between the main chassis 3 and the LCD panel 5, and is fixed to the main chassis front side by screwing, bury-in, or any other appropriate fixing method, thus forming a heat radiating portion. It is to be noted here that the place where the tube is disposed on the front side of the main chassis is the space originally provided for, as described above, arranging the electric wiring lines etc. of the LCD panel, that is, it utilizes the existing space and is not a newly added space for arranging the tube piping on the front side of the main chassis 3. Thus, this is not adverse to the requirement for thinning and miniaturization of the entire equipment.

As shown in FIG. 2, the tube 6 is secured on the front side of the main chassis, while being arranged spirally or in a zigzag or serpentine manner. With this construction, the heat generated by the CPU etc. and transferred to the cooling medium liquid is effectively transferred to the main chassis 3 through the copper tube. The main chassis is originally for forming an overall computer framework that is coupled with the stand 2, and it has a considerably large area in total and is made of a metal material. Accordingly, all the area of the front and rear sides of the chassis can be used for external heat radiation, thus achieving a high efficiency heat radiation.

Referring to FIG. 2 again, the tube 6 fixed, for example, spirally, on the front surface of the main chassis 3 has a possibility that the cooling medium liquid will leak at the joints of its flexion or bending portions due to thermal shrinkage thereof. To prevent the thus leaked cooling medium liquid from flowing along the main chassis down to the stand, a liquid receiver 11 for collecting that cooling medium liquid is provided at the lower part on the front side of the main chassis. The main chassis is usually kept in an upright state or a state slightly inclined with respect to the upright state, and the leaked liquid flows downward along the surface of the main chassis and can be collected in the liquid receiver 11. Although FIG. 2 shows the example where the liquid receiver 11 is disposed on the front surface side of the main chassis 3, another liquid receiver may be provided on the back side to collect the leakage liquid coming down along the tube.

Further, a cover 12 is provided for covering the whole of the computer body 1. A portion of the cover 12 that corresponds to the lower portion of the space between the LCD panel 5 and the main chassis 3 is formed with an air inlet 13 for air-cooling the heat radiating portion that comprises the heat transporting tube and the main chassis. Similarly, the upper portion of the cover 12 is also formed with an air outlet 14 for exhausting air. An air flow-through path from the air inlet 13 to the air outlet 14 has a chimney effect for air to effect a further air-cooling on the heat generating portion, thus improving the cooling efficiency.

In a modification of the first embodiment of the invention described above, an air ventilating fan is provided at the lower portion in the cover to forcedly take in air for heat exchange at the heat generating portion and then exhaust the air, thus further improving the cooling efficiency.

As mentioned above, according to the first embodiment of the invention, the casing (or cover) of a currently used desk-top type computer can be used as it is without changing its size. Further, a large surface area of both the front and back sides of the main chassis can be utilized in radiation of heat to achieve an even more improved heat radiation effect. Furthermore, the chimney effect of air at the heat radiating portion of the tube is expected to further improve the heat radiation effect.

Figure 4:
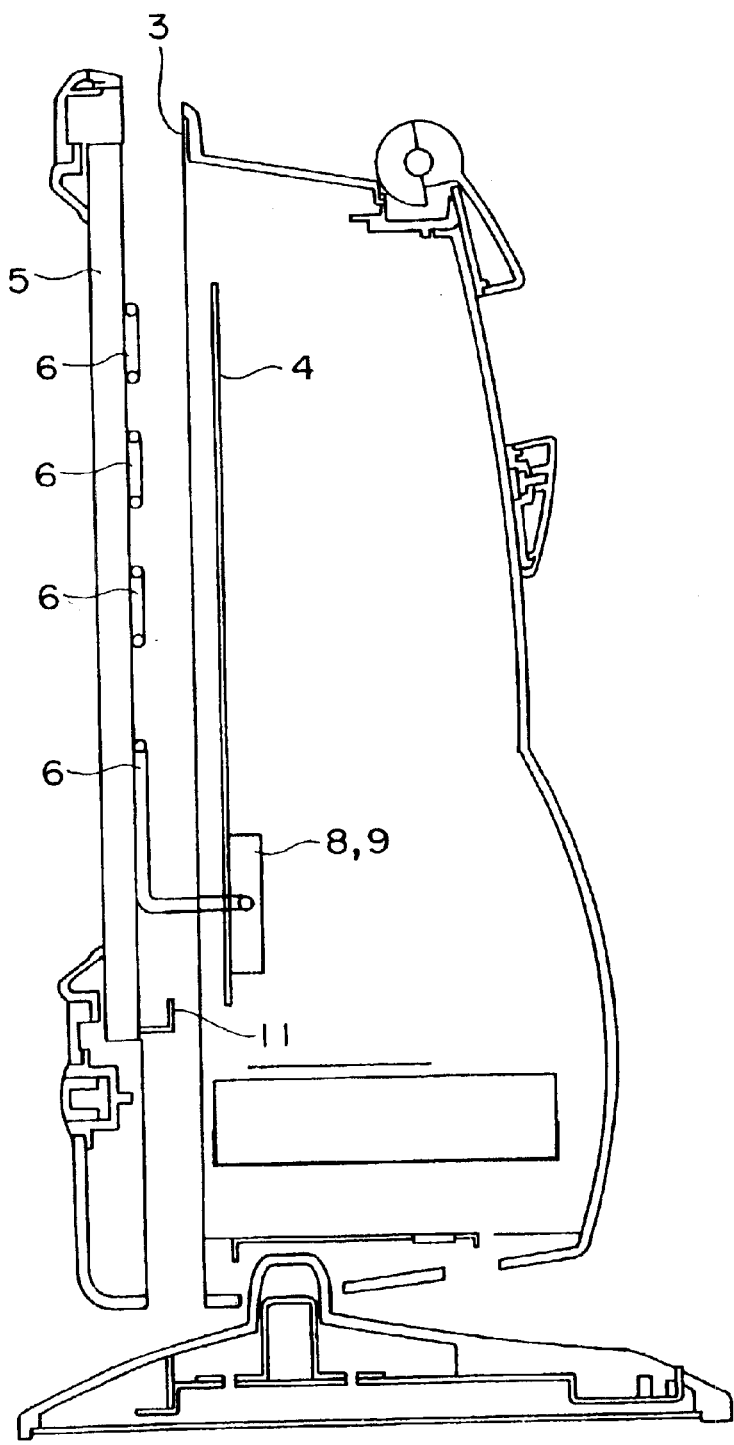
FIG. 4 is a section view of another embodiment of the invention, in which a tube is secured to an LCD panel for heat radiation.

FIG. 4 now shows a configuration example for liquid cooling of a desk-top type computer according to another embodiment of the invention. As shown in FIG. 4, this embodiment is so constructed that a tube goes through a pump, a heat receiving head, and an opening in a main chassis and is fixed on the back surface of an LCD panel to form a heat radiating portion. The back surface of the LCD panel is made of a metal material, and the heat of a cooling medium liquid from the tube, which is arranged spirally or in a zigzag or serpentine manner, can be transferred effectively onto the back surface of the LCD panel and radiated.

A space between the LCD panel and the main chassis is utilized for arranging electric wiring lines etc., which are connected with the connectors of the LCD panel in the same manner as described with the embodiment shown in FIG. 1. Accordingly, no additional space is required for arranging the tube on the back surface of the LCD panel to form the heat radiating portion. Also in the embodiment shown in FIG. 4, the heat radiating portion can be provided without changing the external dimensions of the currently-used casing of a desk-top type computer, thus contributing the thinning and miniaturization of the computer.

Furthermore, the back side of the LCD panel has a large area of the metal surface, and heat dissipation can be carried out at high efficiency while utilizing this large area. In addition, the provision of the air inlet in the lower portion of and the air outlet in the upper portion of the cover, which covers the clearance between the LCD panel and the main chassis, form in combination an air flow-through path from the air inlet at the lower part to the air outlet at the upper portion, and an improvement of the heat radiating effect is expected due to the so-called chimney effect.

Figure 10:
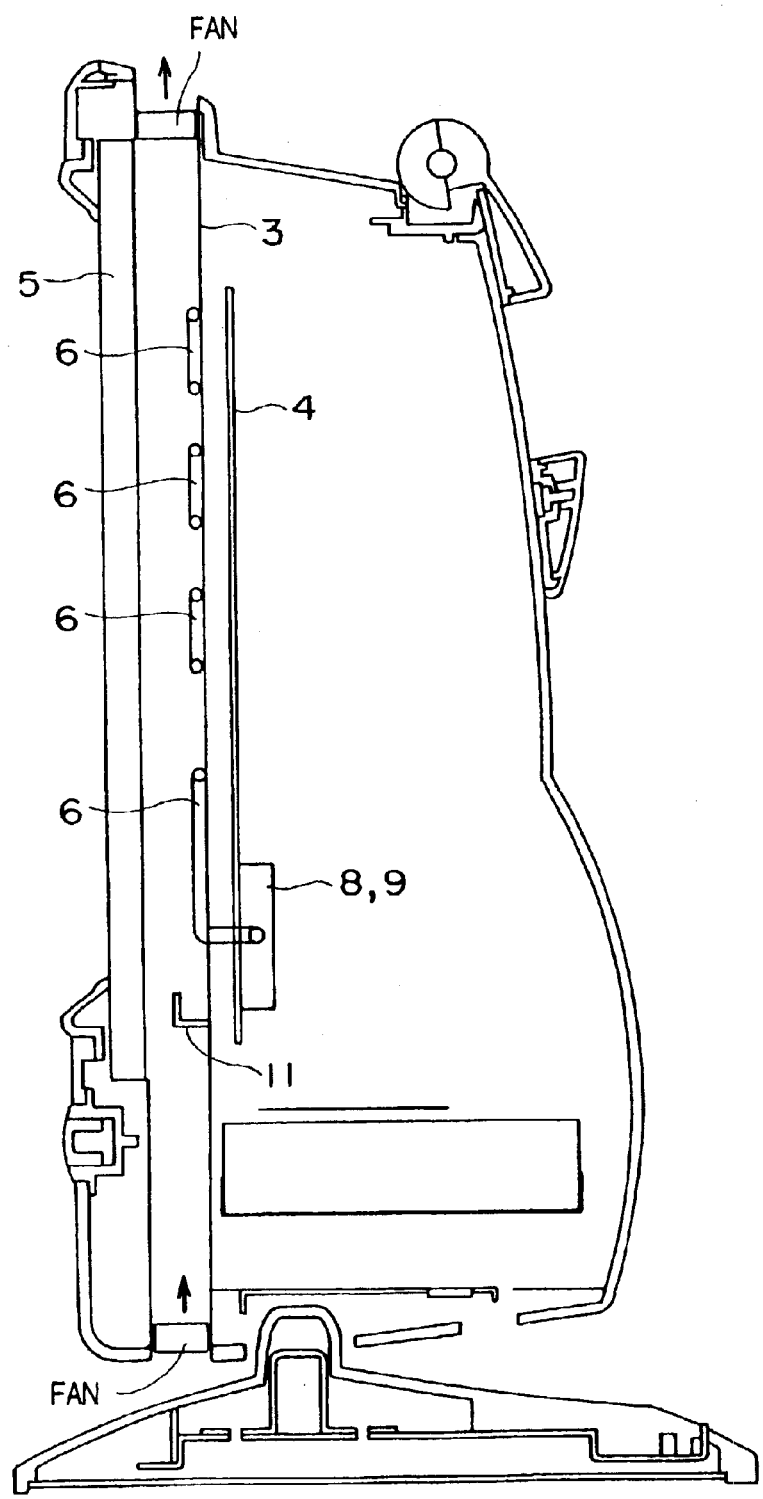
FIG. 10 is a section view showing a configuration for liquid cooling according to an embodiment of the invention, in which fans exhaust heat.

FIG. 10 shows a modification of the air flowing to the heat radiating portion in the embodiment of FIG. 1, in which an air ventilating fan is provided at the lower portion or the upper portion of the cover, which covers the clearance between the LCD panel and the main chassis, or fans are provided at both the upper and the lower portion of the cover, respectively. The provision of the fans shown in FIG. 10 can further expedite the movement of air. Further, the provision of the fans enables the transportation of a large volume of cooling air. This allows the air inlet and outlet openings in the lower and upper portions to be narrowed, thus causing an effect of thinning the apparatus and suppressing the entry of dust and dirt.

Figure 5:
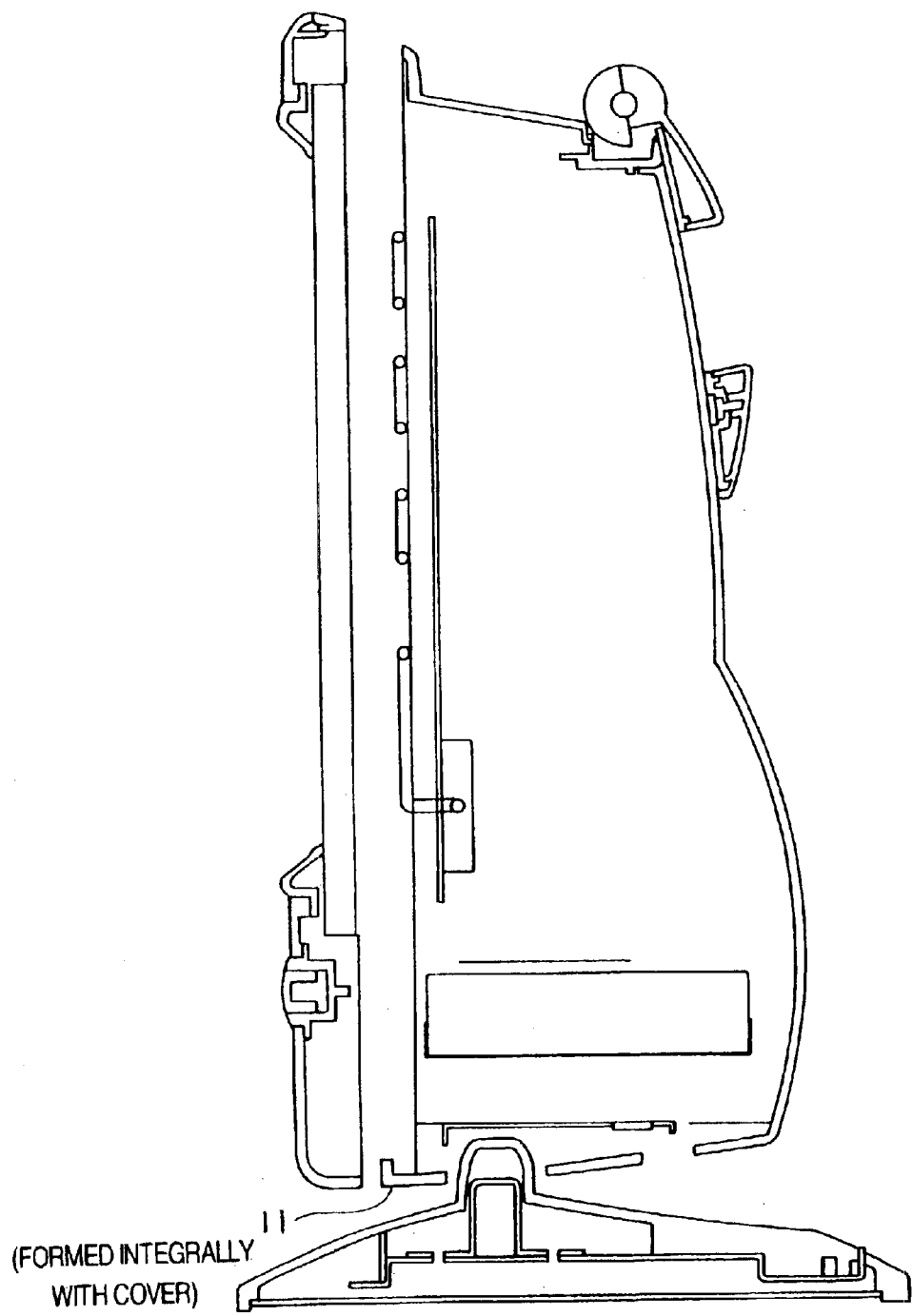
FIG. 5 is a section view showing a configuration example for preventing leakage of a cooling liquid in a desk-top type computer according to still another embodiment of the invention.

FIG. 5 now shows a configuration for prevention of liquid leakage in the liquid cooling of a desktop type computer according to an embodiment of the invention. This embodiment takes a countermeasure for a case where cooling medium liquid leaks at a heat radiating portion in such an arrangement that the heat from a heat receiving head is radiated on the front side of a main chassis as described with the embodiment shown in FIG. 1. In the desk-top type computer with an LCD, which comprises a computer body and a stand, the body is supported by the stand in an upright state or a state slightly inclined from the upright state both in use and not in use, so that the liquid leaking from the heat radiating portion, which relatively tends to cause liquid leakage in the liquid cooling apparatus, flows down to the lowest portion of the main chassis because of the above-mentioned inclination state of the computer body. Accordingly, this embodiment features providing a liquid receiver at the lowest portion of the main chassis.

As can be seen from FIG. 5, the liquid leaking from the heat radiating portion flows downward along the front side surface of the main chassis and is collected by the liquid receiver at the lowest portion of the main chassis. The liquid receiver may be removably attached at the lowest portion of the main chassis in FIG. 5, or it may be formed in one united body with the main chassis. Furthermore, in the configuration example shown in FIG. 5, the liquid receiver is integrated with the cover for collecting the liquid coming downward along the surface of the main chassis.

Furthermore, as the connections or coupling portions of the cooling medium liquid tube are supported to be liable to cause liquid leakage, a liquid receiver may be provided on the back side of the main chassis to receive the liquid leaking from the heat receiving head and the pump. This is because the liquid leaking from that connecting portions of the tube will flow down along the external surface of the tube downward and the back side surface of the main chassis. In addition, to receive the liquid dropping from the lowest portion of the mother board on which the pump or the heat receiving head is mounted, a liquid receiver may be integrated with the cover at a position corresponding to the lowest portion of the mother board. Further, a liquid receiver may be provided on a portion of the stand close to the computer body.

As described above, the embodiments shown in FIGS. 1 and 5 can collect the leaked cooling medium liquid and also prevent it from damaging the devices within the stand.

Figure 6A:
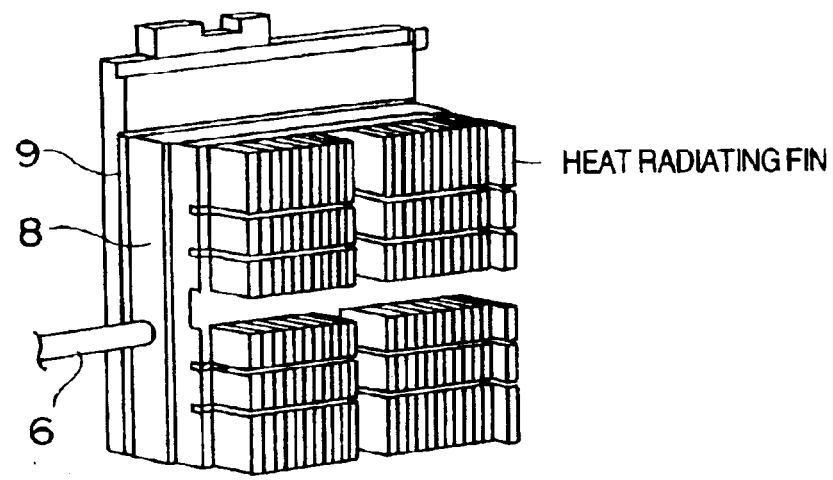
FIGS. 6A and 6B are views illustrating configuration examples for liquid cooling and air cooling of a CPU according to the embodiment of the invention.

FIGS. 6A, B now show configurations for liquid cooling and air cooling in a desk-top type computer according to another embodiment of the invention. The embodiment concerning the configurations shown in FIGS. 6A, B has such a construction that a heat receiving head is fixed to a CPU arranged on a mother board to thereby receive the heat generated by the CPU in order to transfer the generated heat via a cooling medium liquid (water or ethylene glycol) in a tube to a heat radiating portion on the front side of a main chassis or the back side of an LCD panel similarly to the embodiment shown in FIGS. 1 and 4 and that a heat radiating fin is provided on the heat receiving head.

Figure 6B:
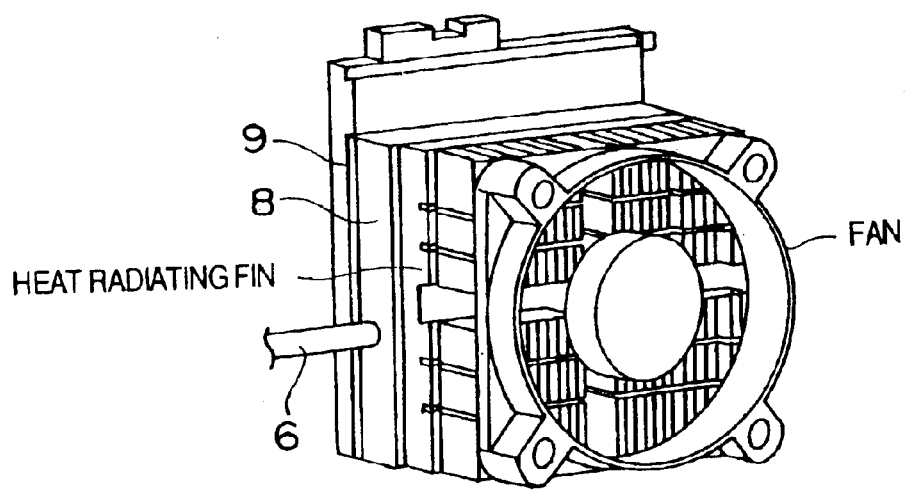

More specifically, the embodiment shown in FIG. 6 aims at radiating by liquid cooling an extra heat that cannot be radiated from the heat radiating fin provided on the heat receiving head. Since the desk-top type computer has an extra space between the back side of the mother board and the rear cover, such a heat radiating fin as provided in this embodiment does not lead to an extra change in the external sizes. FIG. 6B shows a construction in which a fan is further provided on the heat radiating fin on the heat receiving head. The provision of the ventilating fan realizes the effective and rapid radiation of heat from the heat radiating fin.

As mentioned above, the embodiment shown in FIG. 6 applies liquid cooling and air cooling in combination to the heat generating source such as the CPU, and it is possible to increase the maximum capacity of heat radiation and improve the heat radiation efficiency. Furthermore, the embodiment has an advantage that, even when an abnormal situation in the liquid cooling system such as freezing of the cooling medium liquid such as water, the air cooling effect by the heat radiating fin secured to the heat receiving head allows the computer to be operated continuously.

Figure 7C:
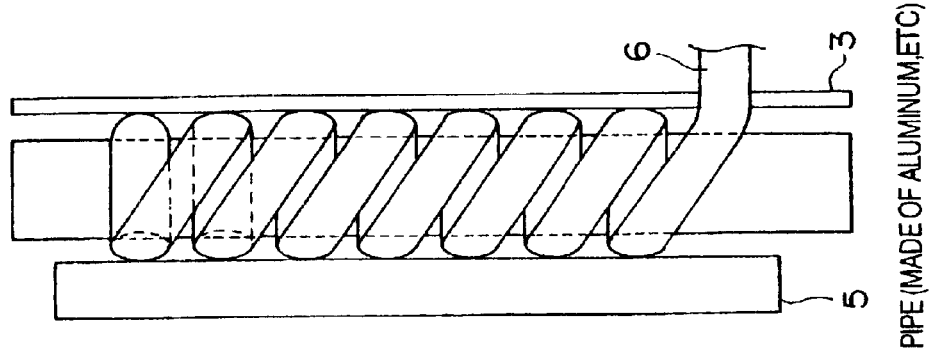
FIGS. 7A, 7B, and 7C are views showing configuration examples concerning the layout of a tube for liquid cooling in embodiments of the invention.
Figure 7B:
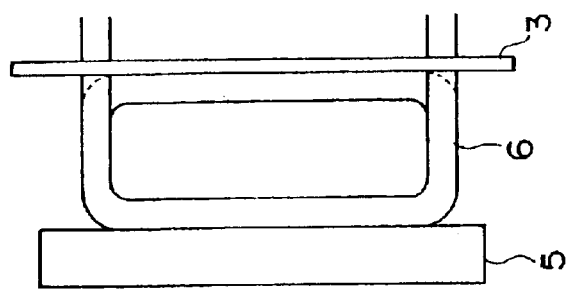
Figure 7A:
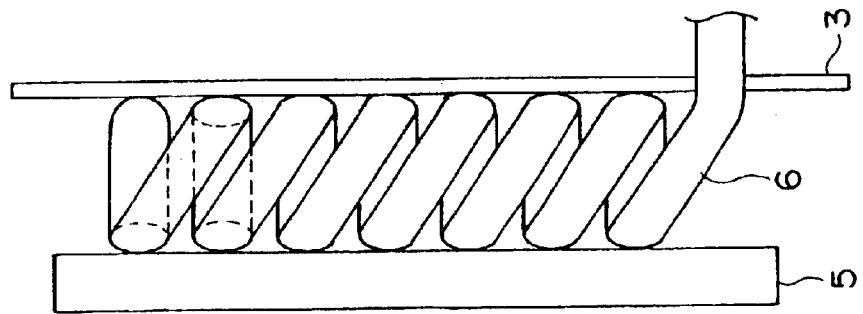
Figure 8:
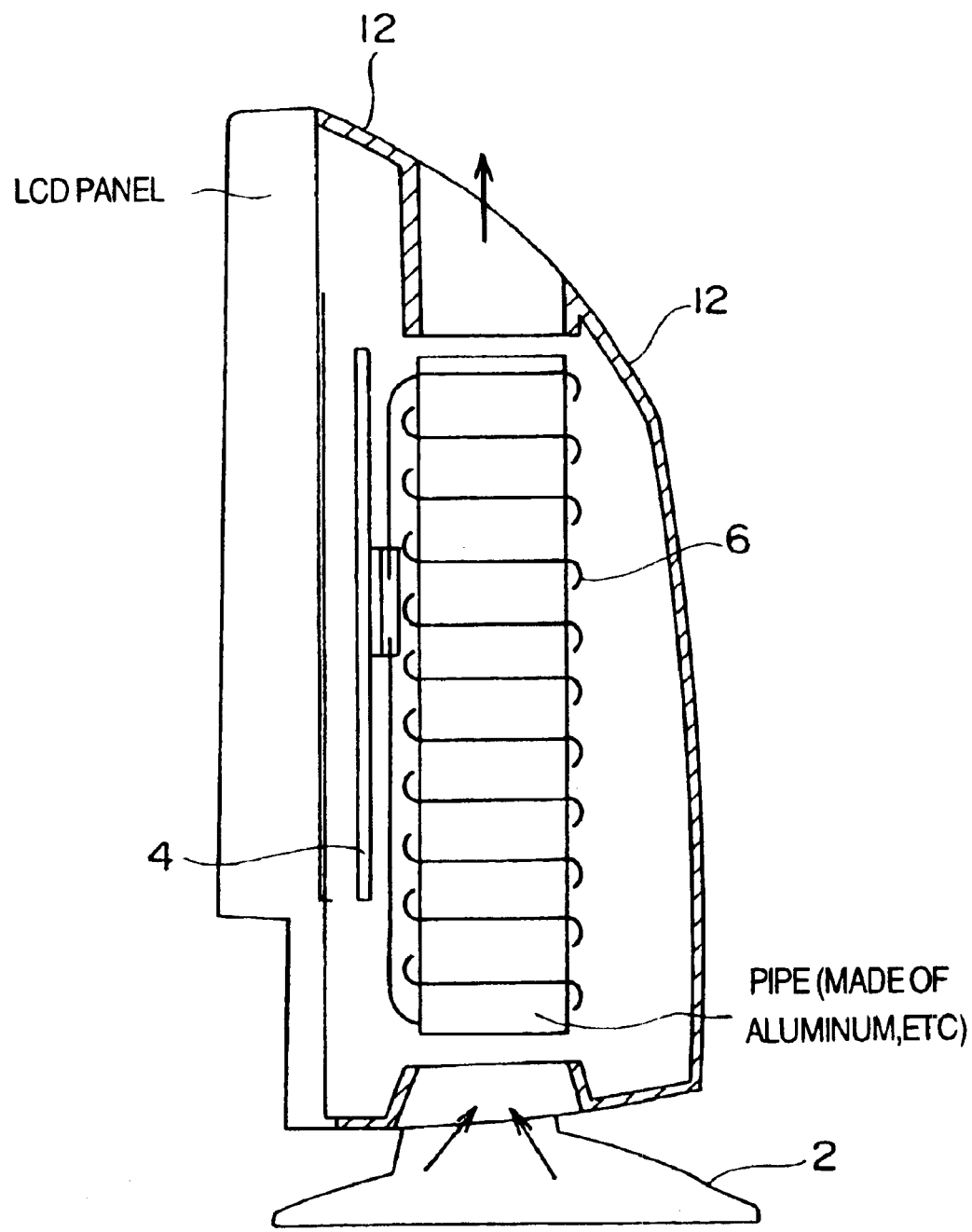
FIG. 8 is a section view showing another configuration example concerning the layout of a tube for liquid cooling in an embodiment of the invention.

FIGS. 7, 8 and 9 show configuration examples concerning the shape and construction of a heat radiating portion in a tube. FIG. 7A is a section view of the configuration in which a spiral tube for heat radiation is disposed between an LCD panel and a main chassis, FIG. 7B is a plan view of the configuration of FIG. 7A as viewed from above, and FIG. 7C is a section view of the other configuration, in which a spiral tube is disposed between an LCD panel and a main chassis and a pipe made of aluminum etc. is disposed at the center of the tube for heat radiation. The examples shown in FIG. 7 employ such a construction that the tube, extending from a heat receiving head through an opening in a main chassis, is led to the back side of the LCD panel and arranged along this back side, and is then led to the main chassis side and arranged along the surface of the main chassis (the arranging order may be reversed), thus forming the heat radiating portion. In this construction, both the LCD panel and the main chassis can serve as heat radiating surfaces, and further improvement of the heat radiation efficiency can be expected. The construction shown in FIG. 7C aims at further improving the heat radiation efficiency by arranging or attaching the heat radiating metal of aluminum etc. in the central space of the spiral tube disposed over the LCD panel and the main chassis.

FIG. 8 shows a configuration example that a spiral tube is arranged between a mother board, on which heat generating elements are mounted, and a rear cover and, in the central space surrounded by this spiral tube, a barrel-shaped heat radiating metal such as aluminum is arranged for heat radiation. In the examples of FIG. 8, openings for air ventilation are formed as an air inlet and an air outlet in portions of the cover corresponding to the upper and lower portions of the barrel-shaped metal. Then, with a hollow structure of this barrel-shaped metal, an air path is formed which extends from the air inlet through the interior of the hollow body to the air outlet, and the heat transferred from the tube to the barrel-shaped metal is effectively radiated thanks to the chimney effect.

FIG. 9A is a view of the example in which a tube is arranged between an LCD panel and a main chassis with no contact and no fixation thereto, and FIG. 9B is a view showing a distance between an LCD panel and a main chassis, which is almost equal to the diameter of a tube, and the tube contacting over its entire length with the LCD panel and the main chassis for heat radiation.

Figure 11C:
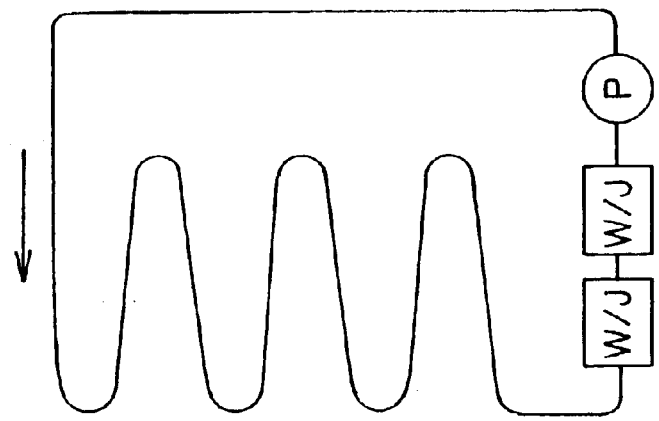
FIGS. 11A, 11B and 11C are schematic diagrams showing the layout of a pump, a heat receiving head, a tube and a liquid flowing direction.
Figure 11B:
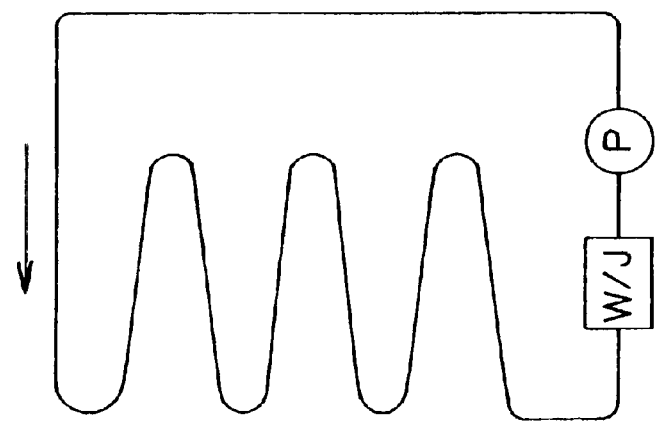
Figure 11A:
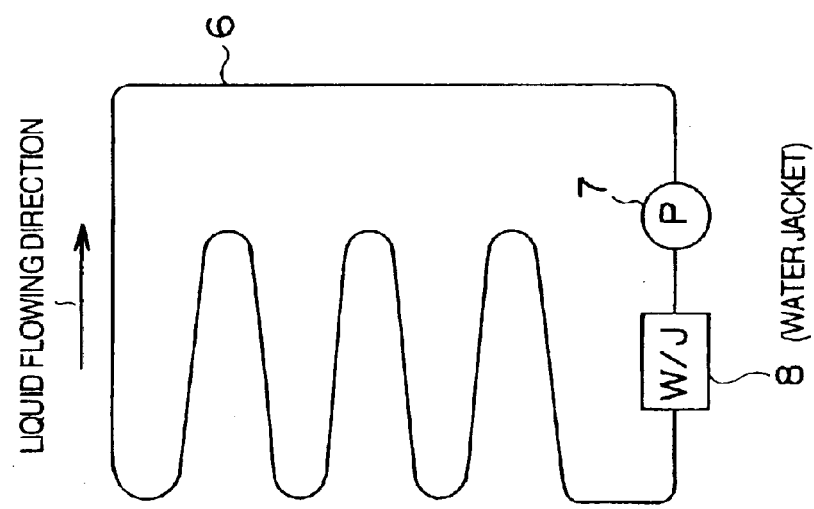

FIG. 11 shows the relationship between a flow direction of a cooling medium liquid and a heat radiating system, which comprises a pump for supplying the cooling medium liquid, a heat receiving head (a water jacket W/J), a tube, and a tube heat-radiating portion formed in a spiral shape or in a zigzag or serpentine shape. In FIG. 11A, the liquid flows in the direction illustrated, and the flow path from the pump through the heat radiating portion up to the top portion is long. Accordingly, although the pump capacity has to be enlarged by that much, air bubbles, which will occur in the cooling medium liquid in the tube including the heat radiating portion, escape upward along the flow, thus enhancing the effect of removing air bubbles. To this end, an air-bubble removing opening is provided at the top portion. In FIG. 11B, since the liquid flows in the direction illustrated, the flow path from the pump to the top portion is short as compared with that of FIG. 11A, and the pump can be reduced in capacity. Further, FIG. 11C shows the situation that, since there are a plurality of heat generating elements besides the CPU as heat generating sources in the desk-top type computer as described above, a plurality of heat receiving heads provided corresponding to the plurality of heat generating elements are thermally connected in series through the tube.

Figure 12:
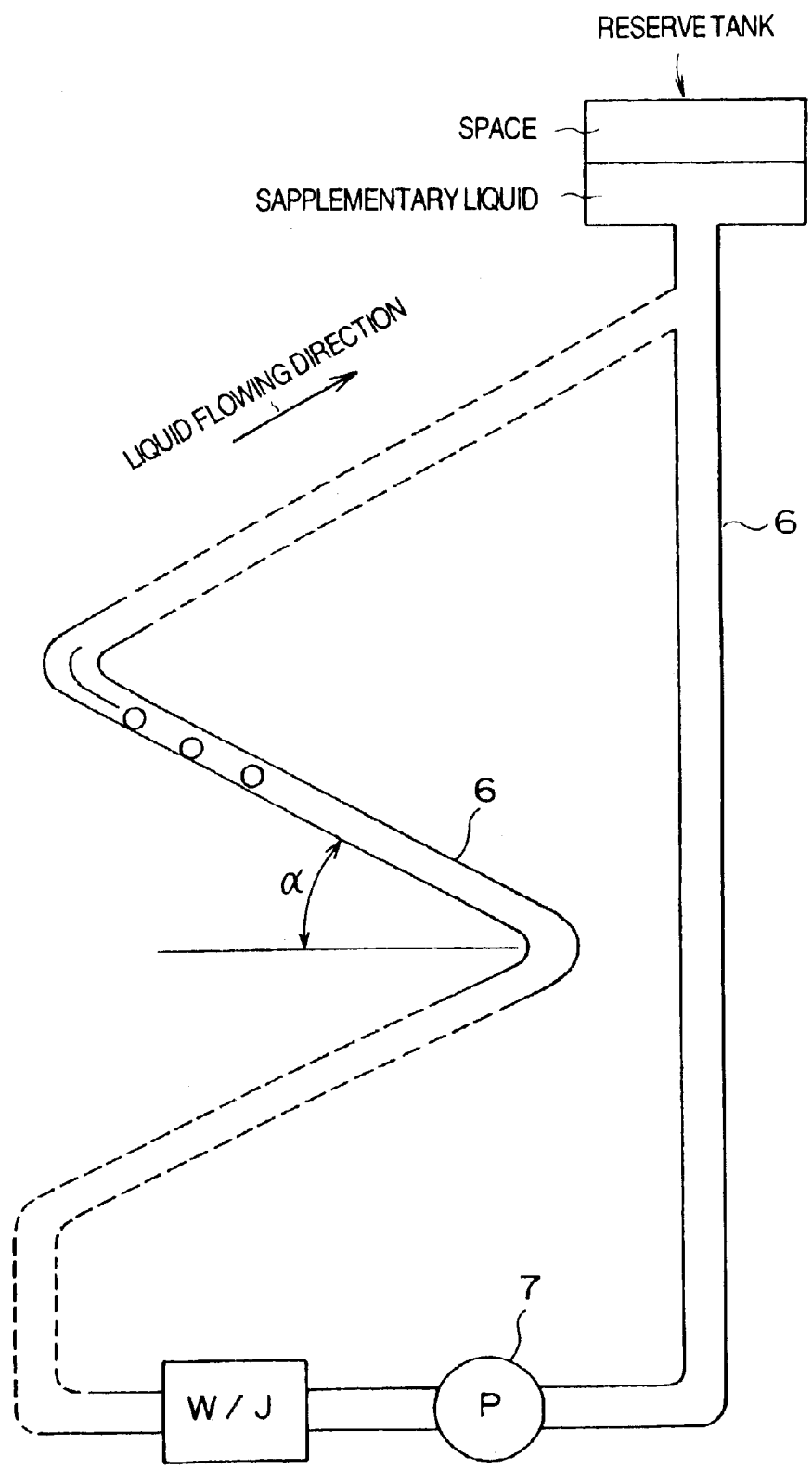
FIG. 12 is a schematic diagram showing the function of a reservoir tank for supplementing a cooling medium liquid and a function of removing air bubbles at the tube, heat radiation portion for liquid cooling according to the embodiment of the invention.

FIG. 12 is a schematic diagram showing the function of a reservoir tank for supplementing the cooling medium liquid and the function of removing air bubbles in the tube heat radiating portion. As shown in FIG. 12, the reservoir tank for the liquid is provided at the highest portion in the circulating path of the cooling medium liquid, i.e., the top of the spiral tube structure or the heat radiating portion, and the liquid in the reservoir tank serves as a supplementary liquid when the cooling liquid leaks from the tube or is evaporated. In addition, the disposition of the reservoir tank at the highest portion of the liquid circulating path causes air bubbles generated in the circulating path to move into the above-mentioned tank.

FIG. 12 also shows the tube heat radiating portion having such a shape that the tube is folded not to simply extend horizontally but in a manner that it goes from one turning point along a path with an inclination angle of a to another turning point. The liquid circulating path is thus inclined at the heat radiating portion to cause air bubbles generated in the cooling medium liquid at the heat radiating portion to easily escape into the reservoir tank. That is, this makes it possible to rapidly eliminate through the reservoir tank air bubbles in the cooling medium liquid, which would occur due to some liquid leakage.

FIG. 13 now shows another configuration example for liquid cooling in a desk-top type computer according to an embodiment of the invention. In this embodiment, the heat radiating portion of a cooling medium liquid tube is formed on a back cover or rear cover provided on the back side of a body, and the back cover is typically made of metal or plastic, so that heat may be radiated to the outside from the heat radiating portion through the back cover of a large surface area. The plastic material of the back cover has almost the same heat radiation properties as those of metal. FIG. 13 also shows a construction that a liquid receiver for collecting a leakage liquid of the cooling medium is provided under the tube heat radiating portion disposed on the back cover.

For maintenance and inspection of the computer which is done typically by removing the back cover to inspect a variety of devices within the body, this embodiment employs a hinge construction by which the back cover can be opened and closed rather than being removed. Alternatively, a construction may be such that the heat radiating portion is provided on the back cover fixed to the body, and when maintenance and inspection, an LCD panel is pushed down forward with its bottom side as a rotary supporting point and then opened with its side as a rotary supporting point for inspection of the internal devices.

FIG. 14 shows further another configuration example for liquid cooling in a desk-top type computer according to an embodiment of the invention. In this embodiment, as viewed from the front side of the computer, an LCD panel, a mother board, a main chassis, a heat radiating portion, and a back cover are arranged in this order. It has a construction that the back cover can be detached from the body, the main chassis is disposed opposite to the back cover, and the heat radiating portion is attached to the main chassis, in which heat is transferred to the back cover through a heat conductor having an elasticity function, which is provided between the heat radiating portion and the back cover. That is, through the elastic heat conductor, the heat radiating portion butts against the back cover with no gap, thus providing a good heat radiating effect.

This embodiment enables heat to be radiated through the back cover of a large heat radiation area and an error in mounting of the back cover to be accommodated by means of the elastic heat conductor.

According to the invention, it is possible to effectively radiate to the outside the heat generated by hot heat generating elements such as a CPU in a desk-top type computer comprising an LCD.

What is claimed is:

1. An all-in-one computer comprising:
   a CPU;
   a display;
   a cooling liquid circulation means comprising a tubular flow path filled with a cooling liquid, a part of said tubular flow path being disposed on a back face of the display;
   a cooling liquid pump connected with the cooling liquid circulation means for circulating the cooling liquid in one direction;
   a CPU cooling section connected to a middle portion of the cooling liquid circulation means and cooling the CPU with the cooling liquid; and
   a reserve tank having an air space and a cooling liquid space at a vertically highest portion of the cooling liquid circulation means.

2. An all-in-one computer according to claim 1, wherein said air space of the reserve tank collects air bubbles in the cooling liquid circulation means, and said cooling liquid space is filled with supplementary cooling liquid.

3. An all-in-one computer comprising:
   a CPU;
   a display;
   a cooling liquid circulation means comprising a tubular flow path filled with a cooling liquid, a part of said tubular flow path being disposed on a back face of the display;
   a cooling liquid pump connected with the cooling liquid circulation means for circulating the cooling liquid in one direction; and
   a CPU cooling section connected to a middle portion of the cooling liquid circulation means and cooling the CPU with the cooling liquid, said CPU cooling section comprising a heat receiving head transferring heat generated by the CPU to the cooling liquid and a heat radiation fin radiating the heat from the heat receiving head, so that the generated heat of the CPU is thermally transferred through the cooling liquid circulation means and is released from the heat radiation fin to atmosphere;
   a reservoir tank connected to the cooling liquid circulation means at a position above the cooling liquid pump for eliminating air bubbles in the cooling medium liquid.

4. An all-in-one computer according to claim 3, wherein said CPU cooling section further comprises a cooling fan and cools the heat radiation fin by said cooling fan.

5. An all-in-one computer according to claim 4, wherein said CPU cooling section has a three-layer structure in which the heat receiving head is mounted on an upper surface of the CPU, the heat radiation fin is attached to an upper surface of the heat receiving head and the cooling fan is mounted on an upper surface of the heat radiation fin.

6. An all-in-one computer according to claim 4, wherein a part of the generated heat of the CPU is transferred to the cooling liquid at the heat receiving head, and a remainder of the heat is forcedly air-cooled at the heat radiation fin by the cooling fan.

7. An all-in-one computer according to claim 4, wherein the generated heat of the CPU is radiated from the heat radiation fin during a normal operation of the computer, and when the heat has a higher temperature, is partially released from the heat radiation fin and is thermally transferred through the cooling liquid circulation means to be radiated.

8. A CPU cooling unit for an all-in-one computer having a CPU, a display, cooling liquid circulation means comprising a tubular flow path filled with a cooling liquid, a part of the tubular flow path being disposed on a back face of the display, and a cooling liquid pump connected with the cooling liquid circulation means for circulating the cooling liquid in one direction, said CPU cooling unit comprising:
   a heat receiving head connected to a middle portion of the cooling liquid circulation means and transferring heat generated by the CPU to the cooling liquid; and
   a heat radiation fin releasing heat stored in the heat receiving head to atmosphere;
   the CPU cooling unit being disposed below a reservoir tank connected to the cooling liquid circulation means for eliminating air bubbles in the cooling liquid.

9. A CPU cooling unit according to claim 8, wherein said heat receiving head is disposed on a thermally connecting face side to the CPU, and said heat radiation fin is provided on an opposite side to a thermally connecting face to the CPU.

10. A CPU cooling unit for an all-in-one computer having a CPU, a display, a cooling liquid circulation means comprising a tubular flow path filled with a cooling liquid, a part of the tubular flow path being disposed on a back face of the display, and a cooling liquid pump connected with the cooling liquid circulation means for circulating the cooling liquid in one direction, said CPU cooling unit comprising:
   a heat receiving head connected to a middle portion of the cooling liquid circulation means and transferring heat generated by the CPU to the cooling liquid; and
   a heat radiation fin subjected to forced radiation of heat stored in said heat receiving head to atmosphere;
   the CPU cooling unit being disposed below a reservoir tank connected to the cooling liquid circulation means for eliminating air bubbles in the cooling liquid.

11. A CPU cooling unit according to claim 10, wherein said heat receiving head is disposed on a thermally connecting face side to the CPU, and said heat radiation fin subjected to forced heat-radiation is provided on an opposite side to a thermally connecting face to the CPU.

* * * * *